US006765290B2

(12) United States Patent
Enriquez et al.

(10) Patent No.: US 6,765,290 B2
(45) Date of Patent: Jul. 20, 2004

(54) ARRANGEMENT FOR BACK-BIASING MULTIPLE INTEGRATED CIRCUIT SUBSTRATES AT MAXIMUM SUPPLY VOLTAGE AMONG ALL CIRCUITS

(75) Inventors: Leonel E. Enriquez, Melbourne Beach, FL (US); Douglas L. Youngblood, Palm Bay, FL (US)

(73) Assignee: Intersil Americas Inc., Milpitas, CA (US)

( * ) Notice: Subject to any disclaimer, the term of this patent is extended or adjusted under 35 U.S.C. 154(b) by 125 days.

(21) Appl. No.: 10/114,142

(22) Filed: Apr. 2, 2002

(65) Prior Publication Data

US 2003/0183922 A1 Oct. 2, 2003

(51) Int. Cl.$^7$ .......................... H01L 23/10; H01L 21/48
(52) U.S. Cl. .................. 257/707; 257/723; 257/685; 257/691; 257/712; 257/706; 257/207; 257/208; 257/291; 257/111; 257/106; 257/114; 438/125; 438/720; 438/122
(58) Field of Search .......................... 257/707, 712, 257/713, 717, 720, 723, 796, 684, 691, 685

(56) References Cited

U.S. PATENT DOCUMENTS

| 3,868,594 A | * | 2/1975 | Cornwell et al. ............. 331/99 |
| 3,892,596 A | * | 7/1975 | Bjorklund et al. ........... 438/331 |
| 4,307,307 A | * | 12/1981 | Parekh ....................... 327/537 |
| 6,574,652 B2 | * | 6/2003 | Burkhard ..................... 718/1 |
| 2002/0134419 A1 | * | 9/2002 | Macris ........................ 136/204 |
| 2003/0143958 A1 | * | 7/2003 | Elias et al. .................. 455/73 |
| 2003/0179549 A1 | * | 9/2003 | Zhong et al. ............... 361/707 |

FOREIGN PATENT DOCUMENTS

| JP | 3-55897 | * | 1/1991 | ................ 439/68 |

* cited by examiner

Primary Examiner—Alexander Oscar Williams
(74) Attorney, Agent, or Firm—Allen, Dyer, Doppelt, Milbrath & Gilchrist, P.A.

(57) ABSTRACT

A diode coupling-based arrangement back-biases each of the semiconductor substrates of a plurality of integrated circuits at the maximum (e.g., most negative) DC voltage applied to any individual circuit, irrespective of a potential variation in applied DC voltages. Each semiconductor chip/substrate includes an auxiliary terminal to which each DC voltage terminal for that chip is diode-coupled. The auxiliary voltage terminal is connected to the underside biasing and thermal dissipation pad of the substrate. When multiple packages are mounted and conductively joined to a shared metallic dissipation region of a support substrate, all auxiliary voltage terminals will be connected in common, so as to back-bias each semiconductor substrate to the most maximum (e.g., most negative) of all applied DC voltages.

17 Claims, 1 Drawing Sheet

ARRANGEMENT FOR BACK-BIASING MULTIPLE INTEGRATED CIRCUIT SUBSTRATES AT MAXIMUM SUPPLY VOLTAGE AMONG ALL CIRCUITS

FIELD OF THE INVENTION

The present invention relates in general to electronic circuits and components therefor, such as, but not limited to those employed in subscriber line interface circuits (SLICs), and is particularly directed to a reduced complexity, diode coupling-based technique for back-biasing each of the semiconductor substrates of a plurality of integrated circuits at the maximum (most negative) DC voltage applied to any individual circuit.

BACKGROUND OF THE INVENTION

In order to optimize the performance of an integrated circuit, it is usually preferred that the semiconductor (silicon) substrate in which transistors of the circuit are formed be back-biased at the largest DC potential applied to the circuit. For the typical case of an N-conductivity type silicon substrate, this means back-biasing the substrate at the most negative DC voltage. Where the conductivity of the IC's substrate is reversed (P-type), the back-biasing voltage is the most positive DC voltage. Coupled with this requirement are continuing industry efforts to reduce circuit packaging size.

To this latter end, many of today's components are packaged using micro lead frame (MLF) technology. As illustrated in the diagrammatic side view of FIG. 1, a typical MLF package 10 contains an integrated circuit chip (semiconductor support structure or substrate/body) 11, in which one or more circuits are formed, and which is mounted atop a thermally and electrically conductive (e.g., metallic) layer or pad 12. The metallic pad 12 serves to both dissipate heat generated within the chip proper and also provides an effective means to back-bias the substrate 11.

The MLF package also includes a plurality of circuit connection leads 13 that extend between external (e.g., surface-mount) connection pads 14 and various input/output and biasing nodes of the chip 11. In the mounted position of the MLF package 10 on a relatively large (compared to the MLF package proper) support substrate 20, the bottom surface 15 of the substrate 11 abuts against an arrangement of (thermally and electrically) conductive vias 21, that extend to a heat dissipation region or medium 22 (such as a metallic plate) of substantial area on the underside of the support substrate 20.

It is often the case that a given circuit architecture, such as but not limited to a SLIC, will be implemented using a plurality of such MLF packages mounted to a common support member, such as the support substrate 20 of FIG. 1. Moreover, the overall circuit architecture may be designed to operate at a plurality of different parameter settings, including the use of different DC voltages for different circuit functions. As a non-limiting example, a SLIC may employ a variable battery supply unit that provides for the selectivity of a high battery voltage (e.g., on the order of −125 VDC), or a low battery voltage (e.g., on the order of −60 VDC), depending upon the intended functionality of the circuit (e.g., voice signaling vs. ringing). In such an architecture, there is a concern that an initially selected battery voltage to back-bias the various IC substrates may become less than the maximum available, where the applied DC voltages are subject to change.

SUMMARY OF THE INVENTION

In accordance with the present invention, this problem is successfully addressed by a reduced complexity, diode coupling-based technique, that is effective to back-bias each of the semiconductor substrates of a plurality of integrated circuits at the maximum (e.g., most negative for N-type semiconductor material) of all DC voltages being applied to the circuit, irrespective of a variation in which voltage is the maximum voltage at any particular time.

For this purpose, each semiconductor chip/substrate is augmented to include an auxiliary voltage terminal that is conductively connected to the underside biasing and thermal dissipation pad of the substrate. Where each integrated circuit is formed in a separate chip, there will be a separate auxiliary voltage terminal for each circuit. Where multiple circuits are formed in a common substrate, the substrate will contain a single auxiliary voltage terminal associated with all of the circuits.

Multiple DC voltage terminals are diode-coupled to a common node feeding an associated auxiliary voltage terminal. In addition, the common node is coupled to the auxiliary voltage terminal through a relatively large valued resistor. The use of a large valued coupling resistor between the common node and the auxiliary voltage terminal serves to comply with safety standards, in the event of a ground fault to a metallic dissipation layer of an underlying support structure on which the semiconductor substrate is mounted, by effectively minimizing current flow to any of the DC voltage terminals. For biasing an N-type semiconductor substrate at the most negative DC voltage, the diodes are connected to the common node in a back-to-back configuration.

This diode-coupling arrangement ensures that the voltage at the auxiliary voltage terminal will always be the most negative of all the DC voltages applied to the plural voltage terminals for the substrate, so that the substrate will be back-biased at the most negative DC voltage applied to any and all of the integrated circuits it contains. In an MLF package, the auxiliary voltage terminal is connected to the substrate's underside pad. With multiple MLF packages mounted and conductively joined to a shared metallic dissipation region of a support substrate, all of the auxiliary voltage terminals will be connected in common. This causes the underside pad of each semiconductor substrate to acquire the most negative of all DC voltages applied.

DETAILED DESCRIPTION

Figure 1:
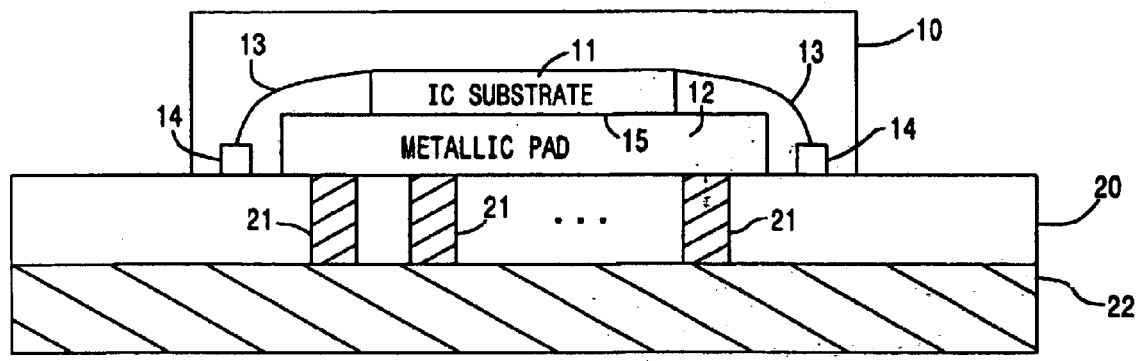
FIG. 1 is a diagrammatic side view of the mounting of a typical MLF package on a support substrate having a heat dissipation region.
Figure 2:
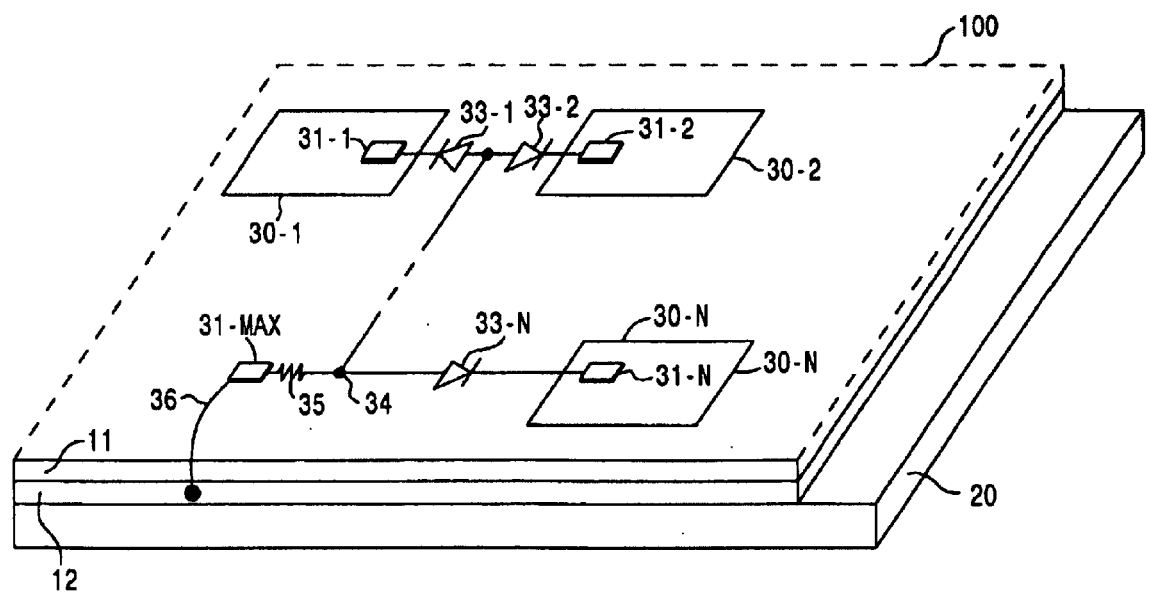
FIG. 2 diagrammatically illustrates the biasing arrangement of the present invention and its application to a circuit architecture containing a plurality of integrated circuits.

Attention is now directed to FIG. 2, which diagrammatically illustrates the biasing arrangement of the present invention and its application to a circuit architecture (such as but not limited to a SLIC), diagrammatically demarcated by broken lines 100, that contains a plurality of integrated circuits 30-1, 30-2, . . . , 30-N. Each integrated circuit ma be packaged individually, or multiple circuits may be contained in a common package. In accordance with a non-limiting, but preferred embodiment, the packaging for the integrated circuits may comprise MLF technology, shown in FIG. 1, referred to above, so that each integrated circuit will be formed in a semiconductor substrate the underside of which contacts a metallic pad for back-biasing and thermal dissipation.

Within the overall circuit architecture, each integrated circuit has one or more voltage terminals to which DC voltages are applied. The DC voltages that are applied to the voltage terminals may be fixed or may be varied (e.g., switchable) among a plurality of voltage values in accordance with the operational functionality of the circuit. In order to reduce the complexity of the drawing, each integrated circuit is shown as having a single DC voltage terminal, respectively referenced as terminals 31-1, 31-2, . . . , 31-N, which are connected to associated pins (not shown) through which various DC voltages are applied to the circuit.

In accordance with the invention, the overall integrated circuit architecture that is formed in each semiconductor chip/substrate is augmented to include an auxiliary voltage terminal 31-MAX. As shown by connection lead 36, this auxiliary voltage terminal is conductively connected to the underside biasing and thermal dissipation pad 12 of the substrate containing the integrated circuit. Thus, if each of the integrated circuits 30-1 . . . 30-N is formed in its own chip, there will be a separate auxiliary voltage terminal for each circuit. For purposes of the illustrated example of the circuit architecture diagram of FIG. 2, where all of the multiple (N) circuits 30 are formed in a common substrate 11, then the substrate will contain a single auxiliary voltage terminal 31-MAX associated with all N circuits.

Irrespective of the implementation employed, each of the voltage terminals 31-$i$ is diode-coupled to auxiliary voltage terminal 31-MAX. In addition, all of the diode-coupling circuit paths from the DC voltage terminals are coupled to the auxiliary voltage terminal 31-MAX through a relatively large valued resistor. This coupling arrangement is shown in FIG. 2 as comprising respective diodes 33-1, 33-2, . . . , 33-N, that are coupled between respective DC voltage terminals 31-1, 31-2, . . . , 31-N and a common node 34. A relatively large valued (e.g., 200 kohms) resistor 35 is coupled between common node 34 and the auxiliary voltage terminal 31-MAX. As noted previously, the use of a large valued coupling resistor between common node 34 and the auxiliary voltage terminal 31-MAX serves to comply with safety standards, in the event of a ground fault to a metallic dissipation layer of an underlying support structure on which the semiconductor substrate is mounted, by effectively minimizing current flow to any DC voltage terminal.

For purposes of biasing an (N-type) semiconductor substrate at the most negative DC voltage, the polarities of the diodes 33-$i$ are such that their cathodes are coupled to the DC voltage terminals 31-$i$ and their anodes are connected to common node 34. Namely, all diodes are connected to the common node 34 in a back-to-back configuration. (Where the conductivity of the IC' substrate is reversed (P-type), the polarities of the diode connections are likewise reversed.)

From an examination of FIG. 2, it can be seen that the voltage at the auxiliary voltage terminal 31-MAX will always be the most negative of all the DC voltages applied to the voltage terminals 31-1, 31-2, . . . , 31-N, thereby ensuring that the substrate will be back-biased at the most negative DC voltage applied to any and all of the integrated circuits. Since auxiliary voltage terminal 31-MAX is connected to substrate underside pad 12, then with multiple packages mounted and conductively joined to a shared metallic dissipation region of a support substrate, all of the auxiliary voltage terminals will be connected in common.

This effectively drives the underside pad of each semiconductor substrate to the most negative of all DC voltages applied to all of the circuits. The large valued coupling resistor between common node 34 and auxiliary voltage terminal 31-MAX effectively minimizes potential current flow to any DC voltage terminal, as in the event of a ground fault to a metallic dissipation layer of an underlying support structure on which the semiconductor substrate is mounted.

As will be appreciated from the foregoing description, the desire to back-bias the semiconductor substrates of a plurality of integrated circuits at the maximum DC voltage being applied to any circuit, irrespective of a potential variation in applied DC voltages, is effectively realized in accordance with the biasing scheme of the present invention, by augmenting the integrated circuit formed in each semiconductor chip/substrate to include an auxiliary terminal to which each DC voltage terminal for that chip is diode-coupled. The auxiliary voltage terminal, in turn, is connected to the underside biasing and thermal dissipation pad of the substrate. As a result, with multiple IC packages mounted and conductively joined to a shared metallic dissipation region of a support substrate, all of the auxiliary voltage terminals will be connected in common, so as to drive the underside pad of each semiconductor substrate to the most maximum (e.g., most negative) of all DC voltages applied to all of the circuits.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein, but intend to cover all such changes and modifications as are obvious to one of ordinary skill in the art.

What is claimed:

1. An integrated circuit arrangement comprising:
   a support structure having a thermal dissipation region; and
   a plurality of integrated circuits formed in at least one semiconductor substrate and having respective power supply terminals therefor, said at least one semiconductor substrate having at least one respective bottom thermally and electrically conductive layer coupled in thermal communication with said thermal dissipation region of said support structure; and wherein
   said power supply terminals are coupled to said at least one respective bottom thermally and electrically conductive layer of said at least one semiconductor substrate, such that said bottom thermally and electrically conductive layer of said at least one semiconductor substrate is coupled to receive the maximum voltage of all voltages applied to said respective power supply terminals.

2. The integrated circuit arrangement according to claim 1, wherein said maximum voltage is the maximum voltage of a prescribed polarity of all the voltages at said respective power supply terminals.

3. The integrated circuit arrangement according to claim 1, wherein a respective integrated circuit comprises a subscriber line interface circuit.

4. The integrated circuit arrangement according to claim 1, wherein said plurality of integrated circuits are formed in a single semiconductor structure, a bottom surface of which has a thermally and electrically conductive layer coupled in thermal communication with said thermal dissipation region of said support structure, and wherein said power supply terminals are coupled to said bottom thermally and electrically conductive layer of said semiconductor structure in such a manner that said thermally and electrically conductive layer of said semiconductor structure is electrically biased at the maximum voltage of a prescribed polarity of all the voltages at said respective power supply terminals.

5. The integrated circuit arrangement according to claim 4, wherein said power supply terminals are diode-coupled to said bottom thermally and electrically conductive layer of said semiconductor structure through a resistor having a value such that said thermally and electrically conductive layer of said semiconductor structure is electrically biased at the maximum voltage of a prescribed polarity of all the voltages at said respective power supply terminals, while minimizing potential current flow between said thermally and electrically conductive layer of said semiconductor structure and any of said respective power supply terminals.

6. The integrated circuit arrangement according to claim 5, wherein each of said power supply terminals is diode-coupled in a common polarity sense to said bottom thermally and electrically conductive layer of said semiconductor structure.

7. A multi-integrated circuit architecture comprising:
a support substrate having a thermal dissipation region; and
a plurality of integrated circuit packages, each of which contains a semiconductor structure in which at least one integrated circuit is formed, a respective integrated circuit having a power supply terminal therefor coupled to receive a DC voltage for circuit operation, said semiconductor structure having a thermally and electrically conductive layer, through which a bias potential is applied to said semiconductor structure, and which is configured to coupled in thermal communication with said thermal dissipation region of said support substrate, the power supply terminal of a respective integrated circuit of said semiconductor structure being coupled to the thermally and electrically conductive layer of said semiconductor structure; and wherein
the electrically and thermally conductive layer of the semiconductor structure of each of said packages is coupled to receive the maximum DC voltage of all the DC voltages received by said power supply terminals.

8. The multi-integrated circuit architecture according to claim 1, wherein a respective integrated circuit comprises a subscriber line interface circuit.

9. The multi-integrated circuit architecture according to claim 7, wherein said maximum DC voltage is the maximum DC voltage of a prescribed polarity of all the DC voltages received by said power supply terminals.

10. The multi-integrated circuit architecture according to claim 7, wherein the semiconductor structure of a respective integrated circuit package contains a plurality of integrated circuits, and wherein power supply terminals of said plurality of integrated circuits are coupled to the bottom thermally and electrically conductive layer of said semiconductor structure in such a manner that said thermally and electrically conductive layer of said semiconductor structure is electrically biased at the maximum voltage of a prescribed polarity of all the voltages received by the power supply terminals of said plurality of integrated circuits.

11. The multi-integrated circuit architecture according to claim 10, wherein the power supply terminals of said plurality of integrated circuits of said semiconductor structure are diode-coupled to said bottom thermally and electrically conductive layer of said semiconductor structure through a resistor having a value such that said thermally and electrically conductive layer of said semiconductor structure is electrically biased at the maximum DC voltage of a prescribed polarity of all the DC voltages received by said power supply terminals, while minimizing potential current flow between said thermally and electrically conductive layer of said semiconductor structure and any of said power supply terminals.

12. The multi-integrated circuit architecture according to claim 10, wherein each power supply terminal is diode-coupled in a common polarity sense to the bottom thermally and electrically conductive layer of said semiconductor structure.

13. A method of biasing at least one bottom thermally and electrically conductive layers of at least one semiconductor structure of an integrated circuit architecture, said at least one bottom thermally and electrically conductive layer being in thermal communication with a thermal dissipation region of a support substrate, said method comprising the steps of:
(a) providing integrated circuits of said integrated circuit architecture with power supply terminals to which DC voltages for operation of said integrated circuits are applied; and
(b) coupling said power supply terminals to said at least one respective bottom thermally and electrically conductive layer of said at least one semiconductor substrate in such a manner that said bottom thermally and electrically conductive layer of said at least one semiconductor substrate will receive the maximum voltage of all DC voltages applied to said respective power supply terminals.

14. The method according to claim 13, wherein said maximum voltage is the maximum DC voltage of a prescribed polarity of all the DC voltages applied to said respective power supply terminals.

15. The method according to claim 13, wherein a respective integrated circuit comprises a subscriber line interface circuit.

16. The method according to claim 13, wherein said plurality of integrated circuits are formed in a single semiconductor structure, a bottom surface of which has a thermally and electrically conductive layer coupled in thermal communication with said thermal dissipation region of said support substrate.

17. The method according to claim 16, wherein step (b) comprises diode-coupling said power supply terminals to said bottom thermally and electrically conductive layer of said semiconductor structure through a resistor having a value such that said thermally and electrically conductive layer of said semiconductor structure is electrically biased at the maximum voltage of a prescribed polarity of all the DC voltages at said respective power supply terminals, while minimizing potential current flow between said thermally and electrically conductive layer of said semiconductor structure and any of said respective power supply terminals.

* * * * *